US007095067B2

(12) United States Patent
Hwang et al.

(10) Patent No.: US 7,095,067 B2
(45) Date of Patent: Aug. 22, 2006

(54) OXIDATION-RESISTANT CONDUCTING PEROVSKITES

(75) Inventors: Harold Y. Hwang, Jersey City, NJ (US); Akira Ohtomo, Sendai (JP); David Muller, Basking Ridge, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 87 days.

(21) Appl. No.: 10/445,414

(22) Filed: May 27, 2003

(65) Prior Publication Data

US 2004/0238861 A1 Dec. 2, 2004

(51) Int. Cl.
*H01L 29/76* (2006.01)

(52) U.S. Cl. ...................... 257/295; 257/213; 257/288; 257/E21.009; 438/3

(58) Field of Classification Search ................ 257/295, 257/296, 297, 298, 299, 300, 301, 302, 304, 257/307, 308, 311, 312, 313, 309, 365, 83
See application file for complete search history.

(56) References Cited

U.S. PATENT DOCUMENTS

| | | | |
|---|---|---|---|
| 5,198,269 | A * | 3/1993 | Swartz et al. |
| 5,635,453 | A * | 6/1997 | Pique et al. |
| 5,645,976 | A | 7/1997 | Azuma |
| 5,838,035 | A * | 11/1998 | Ramesh |
| 6,242,299 | B1 | 6/2001 | Hickert |
| 6,296,777 | B1 | 10/2001 | Engelhardt et al. |
| 6,426,536 | B1 * | 7/2002 | Misewich et al. |
| 6,489,645 | B1 | 12/2002 | Uchiyama |
| 2002/0187600 | A1 * | 12/2002 | Yu et al. |

OTHER PUBLICATIONS

A. Ohtomo, D.A. Muller, J.L. Grazul & H.Y. Hwang; "Artificial Charge-Modulationin Atomic-Scale Perovskite Titanate Superlattices"; Letter to Nature; Nature 419, Sep. 26, 2002; pp. 378-380.

* cited by examiner

*Primary Examiner*—Nathan J. Flynn
*Assistant Examiner*—Kevin Quinto

(57) ABSTRACT

The present invention provides a semicondctor device that includes a conductor comprised of first and second layers of perovskite that have different stoichiometric compositions. The conductors provide a good template for the formation of dielectric layers thereon and are resistant to oxidizing environments used in semiconductor processing.

13 Claims, 3 Drawing Sheets

100 145 150 155 135 105 130 140 125 110 120

OXIDATION-RESISTANT CONDUCTING PEROVSKITES

TECHNICAL FIELD OF THE INVENTION

The present invention is directed, in general, to semiconductor devices, and more specifically, to a semiconductor device comprising a conductive material having an oxidation-resistant perovskite.

BACKGROUND OF THE INVENTION

There is increased interest in using perovskite materials as device components in semiconductor structures, instead of, or in addition to, more conventional materials such as silicon or gallium arsenide. Perovskites are transition metal oxides capable of forming a cubic lattice structure and have a general chemical formula of $ABO_3$ where A and B are cations, and the atoms of A-type cations have a larger diameter than the atoms of the B-type cations. The unit cell of the cubic structure for perovskites have oxygen atoms located at the faces of the cube, a first cation type (e.g., A-type atoms) located at the corners of the cube and a second cation type located (e.g., B-type atoms) in the center of the cube. The chemical structure of perovskites are well known to those skilled in the art and therefore need not be described in further detail.

Certain types of perovskites have been used in nonvolatile memory cells where the perovskite material serves as a polarizable ferroelectric material situated between two conducting plates. Information may be stored in the memory cell by passing an electric current through the conducting plates to generate an electrical field to change the internal polarization of the ferroelectric perovskite material.

There are problems, however, in using ferroelectric perovskites to form such semiconductor structures. For instance, the use of ordered ferroelectric perovskite material in memory cells is desirable because such material has a larger net electric dipole than amorphous ferroelectric perovskite materials. However, conducting plates made of conventional metals, such as platinum, are not conducive to the fabrication of ferroelectric perovskites that have an ordered crystal structure. Moreover it is difficult to grow ordered ferroelectric perovskite crystals on a template comprised of such metals because the metals have a polycrystalline or substantially amorphous structure. As a result, the ferroelectric perovskites formed thereon do not have a sufficiently large net electric dipole for efficient storage of information. Moreover, memory cells having such ferroelectric perovskite materials deposited on a metal plate have a high fatigue factor, meaning that they rapidly lose their ability to be polarized after a few cycles of exposures to alternating electrical fields.

It has also proven difficult to prepare ordered conductive perovskite materials that could be used as a conductive plate instead of conventional metals. In particular, previous preparations of conductive perovskite materials do not provide a smooth ordered layer to serve as a template for the deposition of an ordered perovskite ferroelectric. As a result, similar to that discussed above for metal conductive plates, the perovskite ferroelectric material does not have a sufficiently large net polarization to efficiently store information.

Strontium ruthenate ($SrRuO_3$) perovskites while being good conductors, degrade during subsequent steps in the preparation of the memory cell, such as steps involving exposure to high temperatures (e.g., greater than about 500° C.). In particular, because the Ru atoms are volatile, the $SrRuO_3$ perovskite becomes depleted of Ru, thereby losing its conductive properties. In addition, it has proven difficult to grow a uniform ordered layer of $SrRuO_3$ perovskites.

Another example of a conductive perovskite is lanthanum-doped strontium titanate ($SrTiO_3$), where the lanthanum atoms partially replace the A-type cations in a random fashion, to give an intermixed $La_{x-1}Sr_xTiO_3$ perovskite. The conductivity of such perovskites in thin film form, however, is rapidly lost when the $La_{x-1}Sr_xTiO_3$ perovskite is exposed to processing steps involving high temperatures and high oxygen partial pressure (e.g., about one Torr).

Accordingly, an objective of the invention is to produce conductive perovskite material that is resistant to oxidation and therefore suitable for use in semiconductor structures without encountering the above-mentioned difficulties.

SUMMARY OF THE INVENTION

To address the above-discussed deficiencies, one embodiment of the present invention provides a semiconductor device comprising a conductor. The conductor has a first perovskite layer over a semiconductor substrate and a second perovskite layer on the first perovskite layer. The first perovskite layer has a different stoichiometric composition than the second perovskite layer.

Another embodiment of the invention is a method for forming a semiconductor device. The method includes providing a semiconductor substrate and forming a first a perovskite layer on the substrate and forming a second perovskite layer on the first perovskite layer, where the first perovskite layer has a different stoichiometric composition than the second perovskite layer.

Yet another embodiment of the present invention is a memory cell in a semiconductor structure. The cell comprises a capacitor that includes the above-described conductive layer a dielectric layer on the conductive layer and a second conductive layer on the dielectric layer. The memory cell further includes electrodes electrically coupled to the capacitor and a transistor coupled to the electrodes and the capacitor.

BRIEF DESCRIPTION OF THE DRAWINGS

The invention is best understood from the following detailed description, when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Embodiments of the present invention recognize the advantage in using distinct layers of perovskite materials to form conductors in semiconductor devices. Particular embodiments of conductors are comprised of alternating layers of perovskite different materials that impart the conductor with both high conductivity and resistance to the oxidizing environment associated with the fabrication semiconductor circuits used in memory cells, for example. In addition, because the conductive perovskite materials of the present invention have an ordered lattice structure, they provide a suitable template for the growth of ferroelectric perovskite materials thereon. This, in turn, allows the production of robust memory cells having a high net polarizability and low fatigue factor.

While not limiting the scope of the invention by theory, it is believed that an alternating arrangement of perovskite layers imparts greater oxidation resistance than heretofore recognized because the interface energy between the layers serves to stabilize the entire structure. Moreover, the thickness of the alternating perovskite layers effect the conductor's resistance to oxidation and conductivity. Consider, for instance, a first perovskite layer that serves as insulator layer, while a second perovskite layer acts as a metallic conductor. If however the first perovskite layer is made thick the conductivity is reduced proportionally. Similarly, the second perovskite layer loses its metallic properties if this layer becomes too thick because the interface energies between the first and second layers are insufficient to stabilize it structure and prevent its oxidation.

As noted above, unlike conventional conductive layers made of metal or perovskites, the conductor of the present invention has distinct layers comprising perovskites of different stoichiometric compositions. The first perovskite layer serves as a reservoir for charges introduced from the second perovskite layer. For example, embodiments of the conductor include a first perovskite layer having B-type atoms with an empty d atomic orbital while the second perovskite layer has B-type atoms with one d orbital, as further discussed in Ohtomo, A. et al., Nature 419:378–80 (2002), incorporated by reference herein.

Figure 1:
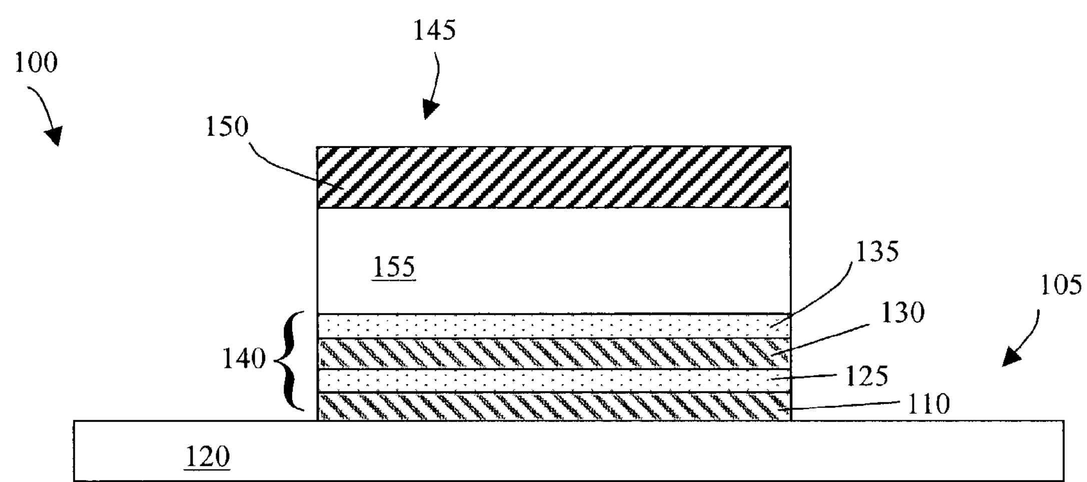
FIG. 1 schematically illustrates a sectional view of a portion of a semiconductor device of the present invention.

FIG. 1 illustrates one embodiment of the present invention, a semiconductor device 100. The device 100 comprises a conductor 105 having a first perovskite layer 110. The first perovskite layer 110 is located a semiconductor substrate 120, and a second perovskite layer 125 is located on the first perovskite layer 110. The first perovskite layer 110 has a different stoichiometric composition than the second perovskite layer 125.

A variety of perovskite materials can be used for the first and second perovskite layers 110, 125. The first perovskite layer 110 has a chemical formula of: $ABO_3$, where A is one or more cations selected from the group consisting of: Na, K, Rb, Mg, Ca, Sr, Ba, Sc, Y, Pb, Bi, La, Ce, Pr, Nd, Sm, Eu, Gd, Er; and B is one or more cations selected from the group consisting of: Sc, Ti, V, Cr, Mn, Fe, Co, Ni, Cu, Zn, Ga, Al, Zr, Nb, Mo, Ru, Ta, W, Re. An exemplary first perovskite layer is strontium titanate ($SrTiO_3$) where A is strontium and B is titanium. Another exemplary first perovskite layer is lanthanum aluminate $LaAlO_3$, where A is lanthanum and B is aluminum.

It is desirable for the lattice structure of the entire conductor 105 to be ordered and thus serve as a suitable template for the formation of an insulating layer thereon. Therefore, the second perovskite layer 125 has a lattice structure similar to the lattice structure of the first perovskite layer 110. In preferred embodiments, the selected second perovskite layer 125 has lattice parameters along an interface with the first perovskite layer that are within about ±5 percent of corresponding lattice parameters of the first perovskite layer 110.

The term lattice parameter as used herein refers to the length of any side in the crystal's cubic unit cell of the perovskite material, such as the first and second layers 110, 125. For example, if the first perovskite layer 110 is strontium titanate ($SrTiO_3$), then the cubic lattice parameter is about 3.91 Angstroms. A suitable second perovskite layer 125 in this example is lanthanum titanate ($LaTiO_3$), having a cubic lattice parameter of about 3.97 Angstroms.

The second perovskite layer 125 comprises material having a general chemical formula of $CDO_3$, where C is one or more cations selected from the group consisting of: Na, K, Rb, Mg, Ca, Sr, Ba, Sc, Y, Pb, Bi, La, Ce, Pr, Nd, Sm, Eu, Gd, Er. Preferred lanthanide series elements include praseodymium, europium, and more preferably lanthanum. D is one or more cations selected from the group consisting of: Sc, Ti, V, Cr, Mn, Fe, Co, Ni, Cu, Zn, Ga, Al, Zr, Nb, Mo, Ru, Ta, W, Re. The C atom of the second perovskite layer, preferably is about the same size as the A atom of the first perovskite layer.

In one preferred embodiment, for example, the first perovskite layer 110 has a chemical formula of $SrTiO_3$, and the second perovskite layer 125 has a chemical formula of $LaTiO_3$. In other embodiments, the second perovskite layer 125 has a chemical formula of $PrTiO_3$ or $EuTiO_3$. In still other embodiments, the D atom is niobium, providing a second perovskite layer 125 of $LaNbO_3$, for example.

A desirable feature of the conductor 105 is that its resistivity can be adjusted over a range, for example, between about $10^{-8}$ Ohm-cm and about $10^{3}$ Ohm-cm. In general, as the thickness of the second perovskite layer 125 and number of layers 125 is increased, the conductor's 105 conductivity increases. At the extreme, however, a conductor 105 made only of a second perovskite layer 125 comprising, for example $LaTiO_3$, has to high a resistivity (i.e., greater than about $10^{4}$ Ohm-cm). Moreover, thicker second perovskite layers 125 which have higher conductivities are increasingly unstable under oxidizing conditions.

Suitable ranges of thicknesses for the first and second perovskite layers 110, 125 are the first perovskite layer 110 comprising between about 1 and about 50 molecular layers and the second perovskite layer 125 comprising between about 1 and about 3 molecular layers. More preferably, the first perovskite layer 110 comprises between about 1 and about 5 molecular layers and the second perovskite layer 125 comprises about 1 molecular layer. The term molecular layer as used herein refers to a layer of the perovskite material having a thickness equal to the lattice parameter for one unit cell. As noted above, for example, a first perovskite layer 110 comprising $SrTiO_3$ has a lattice parameter of about 3.91 Angstroms. Such a first perovskite layer, therefore, has a molecular layer about 3.91 Angstroms thick.

Still other embodiments of the conductor 105 have interleaved layers comprising first and second perovskite materials having the above-discussed stoichiometric composition. For example, certain embodiments of the conductor 105 include a third perovskite layer 130 on the second perovskite layer, wherein the third perovskite layer 130 has substantially the same stoichiometric composition as the first perovskite layer 110. Still other embodiments of the conductor 105 include a fourth perovskite layer 135 on the third perovskite layer 130, wherein the fourth layer 135 comprises a perovskite material having substantially the same stoichiometric composition as the second perovskite layer 125.

The thickness 140 of the conductive layer 105 depends upon the thickness of the first and second 110, 125 or subsequent perovskite layers 130, 135 and the number of times these layers are repeated. It may be desirable to adjust the thickness 140 of the conductor 105 in order to, for example, increase the net conductivity, provide a contact point to the conductor 105, or for other processing considerations well known to those skilled in the art. In certain embodiments, for example, the conductor 105 is between about 10 Angstroms and about 1000 Angstroms thick, and more preferably between about 100 Angstroms and 300 Angstroms thick.

As noted above, the first and second perovskite layers 110, 125 have substantially different stoichiometric compositions. The difference in stoichiometric composition may reside in different identities for one or both of the A and C atoms, or the B and D atoms. For example, the first perovskite layer 110 preferably comprises less than about 10 mole percent, and more preferably less than about 5 mole percent of C atoms and D atoms. Likewise, the second perovskite layer 125 comprises less than about 10 mole percent, and more preferably less than about 5 mole percent of A atoms and B atoms.

Preferred embodiments of the conductor of the present invention have good resistance to oxidizing environments. In some embodiment, for example, the conductor 105, after exposure to an oxidizing environment comprising an oxygen partial pressure of at least about 0.1 atmospheres and a temperature of between about 500 and about 700° C. for at least about 30 minutes, has a resistivity that is less than about one Ohm-cm.

In certain preferred embodiments of the semiconductor device 100, the conductor 105 is a conductive plate in a capacitor 145. Although the conductor 105 can be used to form either the upper 150 or lower 105 conductive plates in the capacitor 145, it is preferable for the conductor 105 to comprise at least the lower conductive plate 105. This follows because as the lower conductive plate 105, the conductor 105 also serves as a template for depositing a dielectric layer 155 thereon. In certain embodiments the dielectric layer 155 comprises a ferro-electric perovskite. In some preferred embodiments, the dielectric layer is crystalline. Advantageously, the ordered structure of the conductor 105 facilitates the formation of the dielectric layer 155 with an ordered crystal structure. Other embodiments include layered materials derived from the perovskite structure, such as $Bi_4Ti_3O_{12}$ or (Sr, Ba)$Nb_2O_6$, for which the perovskite surface gives an suitable template as well.

The ferro-electric perovskite has the general formula $EFO_3$, wherein the E atom is one or more cations selected from the group consisting of: Li, Na, Ba, Bi, and Pb; and the F atom is one or more cations selected from the group consisting of: Nb, Ta, Ti, Mn, Zr. An example of a preferred ferroelectric perovskite is barium titanate ($BaTiO_3$) where E is barium and F is titanium.

Embodiments of the semiconductor device 100 further including a second conductor 150 formed on the dielectric layer 155. The second conductor 150 may be a conductive material that is capable of adhering to the dielectric layer 155. Examples include metals such as titanium, gold, aluminum and platinum. More preferably, the second conductor 150 comprises a perovskite material substantially the same as the conductor 105 because the ordered structure of a perovskite advantageously preserves the structural integrity of the ferroelectric perovskite used as the dielectric layer 155.

Figure 2A:
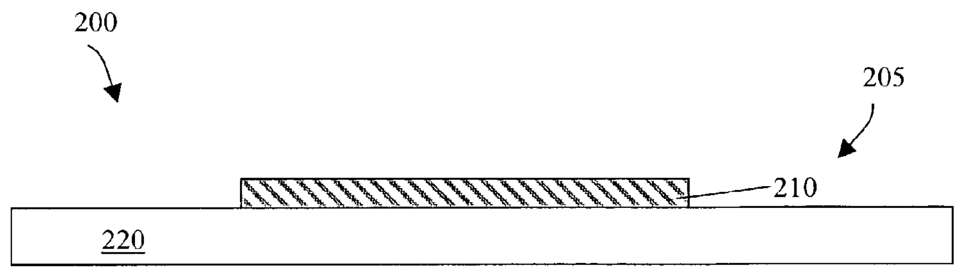
FIGS. 2A–2C illustrate sectional views of the semiconductor device covered by the present invention at various stages of manufacture.
Figure 2B:
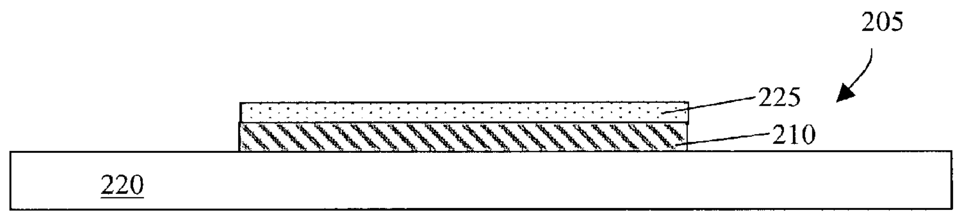
Figure 2C:
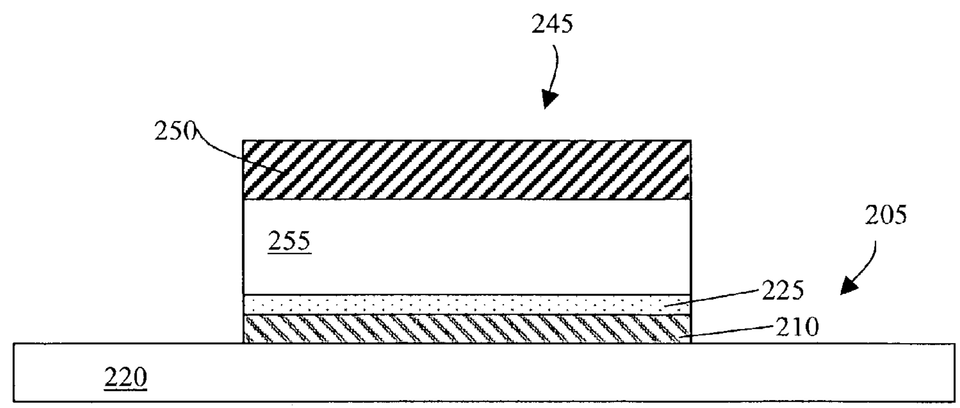

FIG. 2A–C illustrate sectional views of a semiconductor device 200 covered by the present invention at various stages of manufacture. Like reference numbers are used for structures analogous to the device shown in FIG. 1. As illustrated in FIG. 2A, the method of forming a semiconductor device 200 include providing a semiconductor substrate 220. In preferred embodiments, the semiconductor substrate 220 is silicon or another perovskite material. Preferably, the semiconductor substrate has a flat surface such that when the conductive layer 205 is epitaxially grown on the semiconductor substrate 220, the conductive layer 205 has an upper surface 207 with substantially the same degree of flatness as the underlying substrate's surface 222.

Forming the conductive layer 205 includes alternately depositing the first and second perovskite layers 210, 225 over the semiconductor substrate 220, as illustrated in FIGS. 2A and 2B and 2C, respectively. In certain preferred embodiments, the first perovskite layer 210 is formed on the substrate 220 and the second perovskite layer 225 is formed on the first perovskite layer 210. In still other preferred embodiments, the first and second perovskite layers 210, 225, are crystalline and have lattice constants that differ by less than 5 percent. Methods for the precise deposition of molecular layers of perovskites are well known to those skilled in the art and include molecular beam epitaxy, chemical vapor deposition, atomic layer deposition, sputtering and pulsed laser deposition. Similar methods may be used to deposit a dielectric layer comprising a ferroelectric perovskite 255, on the conductive layer 205, and a second conductive layer 250 on the dielectric layer 255, to form a capacitor 245, as illustrated in FIG. 2C.

For example, distinct molecular layers of the first and second perovskite 210, 225 comprising $SrTiO_3$ and $LaTiO_3$, respectively, can be grown in an ultra-high vacuum chamber by pulsed laser deposition, using a single crystal $SrTiO_3$ target and a polycrystalline $La_2Ti_2O_7$ target, respectively. The process was started with atomically flat, $TiO_2$-terminated $SrTiO_3$ substrates which exhibit terraces several hundred nanometers wide, separated by 3.91 Angstrom unit cell steps, as observed by atomic force microscopy. A KrF excimer laser with a repetition rate of 4 Hz was used for ablation, with a laser fluence at the target surface of about 3 $J/cm^2$. The films were grown at about 750° C. with an oxygen partial pressure of about $1\times10^{-5}$ Torr, for stabilizing both valence states of titanium. Unit cell reflection high-energy electron diffraction intensity oscillations were observed throughout the growth, and were used to calibrate the number of layers grown. After growth, the films were annealed in flowing oxygen at about 400° C. for about 2 to 10 hours to fill residual oxygen vacancies.

Figure 3:
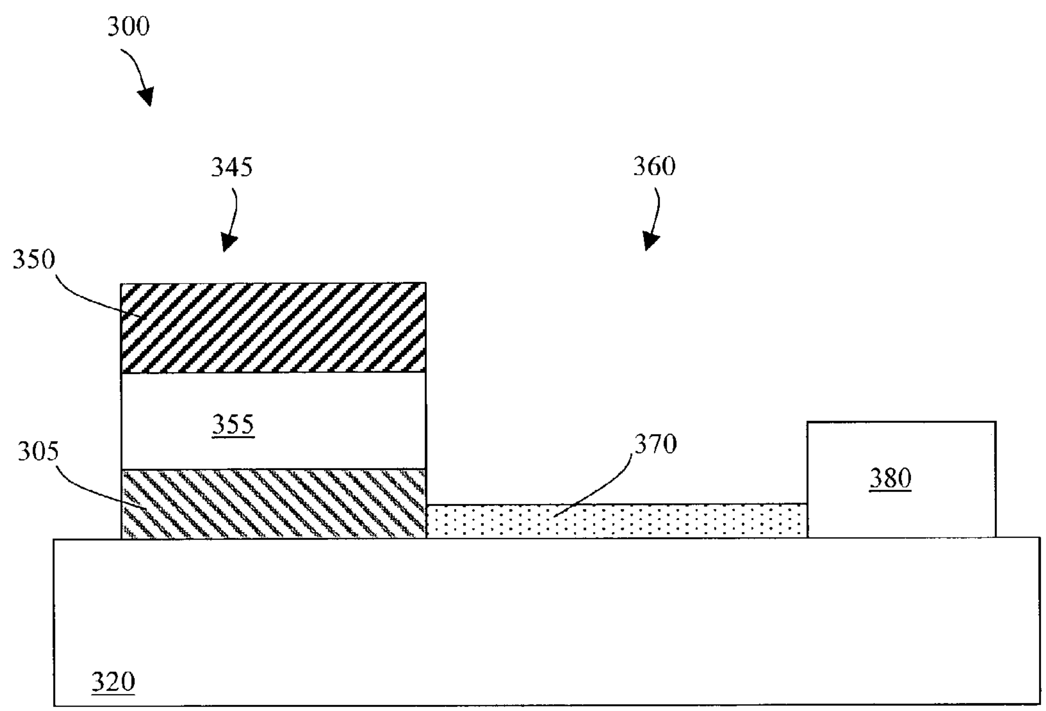
FIG. 3 schematically illustrates a sectional view of a portion of a memory cell in a semiconductor circuit incorporating the device of the present invention.

FIG. 3 illustrates another aspect of the present invention, a memory cell 360 in a semiconductor structure 300. Again, like reference numbers are used to illustrate structures analogous to that depicted in FIGS. 1 and 2. The memory cell 360 comprises a capacitor 345 that includes a conductive layer 305, a dielectric layer 355 on the conductive layer 305 and a second conductive layer 350 on the dielectric layer 355. One of both of the conductive layers 305, 350 may comprise any of the above-discussed perovskite structures, such as the conductor 105 in FIG. 1. The memory cell 360 further includes one or more electrodes 370 electrically coupled to the capacitor 345 and a transistor 380 coupled to the electrode 370 of the capacitor 345.

Although the present invention has been described in detail, those of ordinary skill in the art should understand that they can make various changes, substitutions and alterations herein without departing from the scope of the invention.

What is claimed is:

1. A semiconductor device, comprising:

a conductor having a first perovskite layer over a semiconductor substrate and a second perovskite layer on said first perovskite layer, said first perovskite layer having a different stoichiometric composition than said second perovskite layer and wherein said second perovskite layer has lattice parameters along an interface with said first perovskite layer that are within about ±5 percent of corresponding lattice parameters of said first perovskite layer, wherein said first perovskite layer comprises between about 1 and about 50 molecular layers and said second perovskite layer comprises between about 1 and about 3 molecular layers.

2. The semiconductor device as recited in claim 1, wherein said first perovskite layer has a chemical formula of $ABO_3$, where said A is one or more cations selected from the group consisting of:

Na; K; Rb; Mg; Ca; Sr; Ba; Sc; Y; Pb; Bi; La; Ce; Pr; Nd; Sm; Eu; Gd; and Er; and said B is one or more cations selected from the group consisting of:

Sc; Ti; V; Cr; Mn; Fe; Co; Ni; Cu; Zn; Ga; Al; Zr; Nb; Mo; Ru; Ta; W; and Re.

3. The semiconductor device as recited in claim 1, wherein said second perovskite layer has a general chemical formula of $CDO_3$, where said C is one or more cations selected from the group consisting of:

atoms from the lanthanides series of elements;

Na; K; Rb; Mg; Ca; Sr; Ba; Sc; Y; Pb; Bi; La; Ce; Pr; Nd; Sm; Eu; Gd; and Er; and said D is one or more cations selected from the group consisting of:

Sc; Ti; V; Cr; Mn; Fe; Co; Ni; Cu; Zn; Ga; Al; Zr; Nb; Mo; Ru; Ta; W; and Re.

4. A semiconductor device, comprising:

a conductor having a first perovskite layer over a semiconductor substrate and a second perovskite layer on said first perovskite layer, said first perovskite layer having a different stoichiometric composition than said second perovskite layer, wherein said second perovskite layer has a general chemical formula of $CDO_3$ and wherein said C atom is lanthanum and said D atom is titanium.

5. A semiconductor device, comprising:

a conductor having a first perovskite layer over a semiconductor substrate and a second perovskite layer on said first perovskite layer, said first perovskite layer having a different stoichiometric composition than said second perovskite layer wherein said second perovskite layer has a general chemical formula of $CDO_3$, where said C is one or more cations selected from the group consisting of:

atoms from the lanthanides series of elements;

Na; K; Rb; Mg; Ca; Sr; Ba; Sc; Y; Pb; Bi; La; Ce; Pr; Nd; Sm; Eu; Gd; and Er; and said D is one or more cations selected from the group consisting of Sc; Ti; V; Cr; Mn; Fe; Co; Ni; Cu; Zn; Ga; Al; Zr; Nb; Mo; Ru; Ta; W; and Re;

wherein said second perovskite layer has lattice parameters along an interface with said first perovskite layer that are within about ±5 percent of corresponding lattice parameters of said first perovskite layer, and wherein said first perovskite layer comprises between about 1 and about 50 molecular layers and said second perovskite layer comprises between about 1 and about 3 molecular layers.

6. The semiconductor device as recited in claim 5, wherein said first perovskite layer comprises between about 1 and about 5 molecular layers and said second perovskite layer comprises about 1 molecular layer.

7. A semiconductor device, comprising:

a conductor having a first perovskite layer over a semiconductor substrate and a second perovskite layer on said first perovskite layer, said first perovskite layer having a different stoichiometric composition than said second perovskite layer, wherein said conductor further includes a third perovskite layer on said second perovskite layer, wherein said third perovskite layer has substantially the same stoichiometric composition as said first perovskite layer.

8. A semiconductor device comprising:

a conductor having a first perovskite layer over a semiconductor substrate and a second perovskite layer on said first perovskite layer, said first perovskite layer having a different stoichiometric composition than said second perovskite layer and wherein said second perovskite layer has lattice parameters along an interface with said first perovskite layer that are within about ±5 percent of corresponding lattice parameters of said first perovskite layer, wherein said conductor, after exposure to an oxidizing environment comprising an oxygen partial pressure of at least about 0.1 atmospheres and a temperature of between about 500 and about 700° C. for at least about 30 minutes, has a resistivity of less than about one Ohm-cm.

9. A semiconductor device comprising:

a conductor having a first perovskite layer over a semiconductor substrate and a second perovskite layer on said first perovskite layer, said first perovskite layer having a different stoichiometric composition than said second perovskite layer, wherein said conductor is a conductive plate in a capacitor, and a dielectric layer on said conductive plate, wherein said dielectric layer is a ferro-electric perovskite having the general formula $EFO_3$, wherein said E is one or more cations selected from the group consisting of:

Li; Na; Ba; Bi; and Pb; and said F is one or more cations selected from the group consisting of:

Nb; Ta; Ti; Mn; and Zr.

10. The semiconductor device as recited in claim 9, further including a second conductor formed on said dielectric layer.

11. A method for forming a semiconductor device comprising:

providing a semiconductor substrate; and forming a first a perovskite layer on said substrate; and forming a second perovskite layer on said first perovskite layer, said first perovskite layer having a different stoichiometric composition than said second perovskite layer wherein said first and second perovskite layers are crystalline and have lattice constants that differ by less than 5 percent, and wherein interleaved said first and said second perovskite layers are formed by alternately depositing said first perovskite layer and second perovskite layer over said semiconductor substrate.

12. A method for forming a semiconductor device comprising:

providing a semiconductor substrate; and forming a first a perovskite layer on said substrate;

forming a second perovskite layer on said first perovskite layer, said first perovskite layer having a different stoichiometric composition than said second perovskite layer and further includes forming interleaved layers comprising said first and said second perovskite layers by alternately depositing said first perovskite layer and second perovskite layer over said semiconductor substrate, wherein said first and second perovskite layers are crystalline and have lattice constants that differ by less than 5 percent; and depositing a dielectric layer on said first and second perovskite layers and depositing a conducting layer on said dielectric layer.

13. A memory cell in a semiconductor structure comprising:

a capacitor including:

a conductive layer over a semiconductor substrate, said conductive layer having a first perovskite layer and a second perovskite layer on said first perovskite layer, said first perovskite layer having a different stoichiometric composition than said second perovskite layer and wherein said second perovskite layer has lattice parameters along an interface with said first perovskite layer that are within about ±5 percent of corresponding lattice parameters of said first perovskite layer;

a dielectric layer on said conductive layer; and a second conductive layer on said dielectric layer;

electrodes electrically coupled to said capacitor; and a transistor coupled to said electrodes and said capacitor.

* * * * *